United States Patent
Mutnury et al.

(10) Patent No.: US 11,513,150 B1
(45) Date of Patent: Nov. 29, 2022

(54) IN-SITU SOLDER JOINT CRACK DETECTION

(71) Applicant: DELL PRODUCTS, LP, Round Rock, TX (US)

(72) Inventors: Bhyrav Mutnury, Austin, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/404,676

(22) Filed: Aug. 17, 2021

(51) Int. Cl.
*G01R 31/11* (2006.01)
*G01R 31/28* (2006.01)

(52) U.S. Cl.
CPC ..... *G01R 31/2812* (2013.01); *G01R 31/2818* (2013.01)

(58) Field of Classification Search
CPC ............ G01R 31/2812; G01R 31/2818; G01R 31/2632; G01R 31/2837; G01R 31/2825; G01R 31/54; G01R 31/55; G01R 31/66; G01R 31/67; G01R 31/70; G01R 31/71; G01R 31/72
See application file for complete search history.

(56) References Cited

U.S. PATENT DOCUMENTS

| | | | |
|---|---|---|---|
| 6,590,409 B1 * | 7/2003 | Hsiung | G01R 31/2853 324/754.21 |
| 9,263,410 B2 | 2/2016 | Guo | |
| 11,087,670 B2 * | 8/2021 | Mandlik | G09G 3/035 |
| 11,183,089 B2 * | 11/2021 | Ryu | G01R 31/2825 |
| 2006/0191889 A1 * | 8/2006 | Hofmeister | G01R 31/71 219/233 |
| 2012/0015457 A1 | 1/2012 | Rawlinson et al. | |
| 2012/0217976 A1 * | 8/2012 | Clarkson | G01R 31/71 324/538 |
| 2020/0309864 A1 * | 10/2020 | Chen | G01R 31/71 |
| 2021/0272488 A1 * | 9/2021 | Hwang | G09G 3/20 |

FOREIGN PATENT DOCUMENTS

JP 2014228330 A 12/2014

* cited by examiner

*Primary Examiner* — Thang X Le
(74) *Attorney, Agent, or Firm* — Larson Newman, LLP

(57) ABSTRACT

A system detects cracks in solder joints on a printed circuit board (PCB). The system includes a device, a signal generator, a termination resistor, and a detector. The device includes a first contact and a second contact coupled to the first contact. The device is soldered to the PCB by a first solder joint at the first contact and by a second solder joint at the second contact. The signal generator has a test signal output coupled to the first solder joint. The termination resistor has a first terminal coupled to the second solder joint, and a second terminal coupled to a ground plane of the PCB. The detector receives a reflected signal that is a reflection of the test signal from at least one of the first solder joint, the second solder joint, and the termination resistor. The detector provides an indication as to whether or not at least one of the first solder joint and the second solder joint is cracked based upon a magnitude of the reflected signal.

20 Claims, 5 Drawing Sheets

IN-SITU SOLDER JOINT CRACK DETECTION

FIELD OF THE DISCLOSURE

This disclosure generally relates to information handling systems, and more particularly relates to providing in-situ solder joint crack detection in a printed circuit board for an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A system may detect cracks in solder joints on a printed circuit board (PCB). The system may include a device, a signal generator, a termination resistor, and a detector. The device may include a first contact and a second contact coupled to the first contact. The device may be soldered to the PCB by a first solder joint at the first contact and by a second solder joint at the second contact. The signal generator may have a test signal output coupled to the first solder joint. The termination resistor may have a first terminal coupled to the second solder joint, and a second terminal coupled to a ground plane of the PCB. The detector may receive a reflected signal that is a reflection of the test signal from at least one of the first solder joint, the second solder joint, and the termination resistor. The detector may provide an indication as to whether or not at least one of the first solder joint and the second solder joint is cracked based upon a magnitude of the reflected signal

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
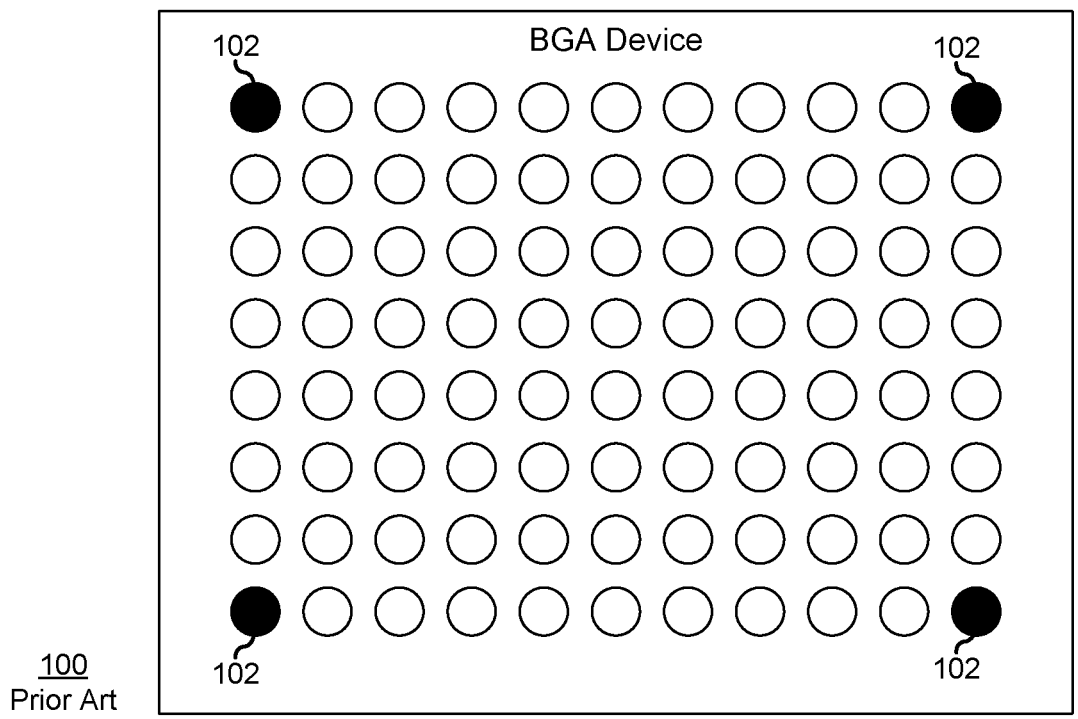
FIG. 1 illustrates a ball grid array (BGA) device according to the prior art and another BGA device according to an embodiment of the current disclosure.
Figure 1:
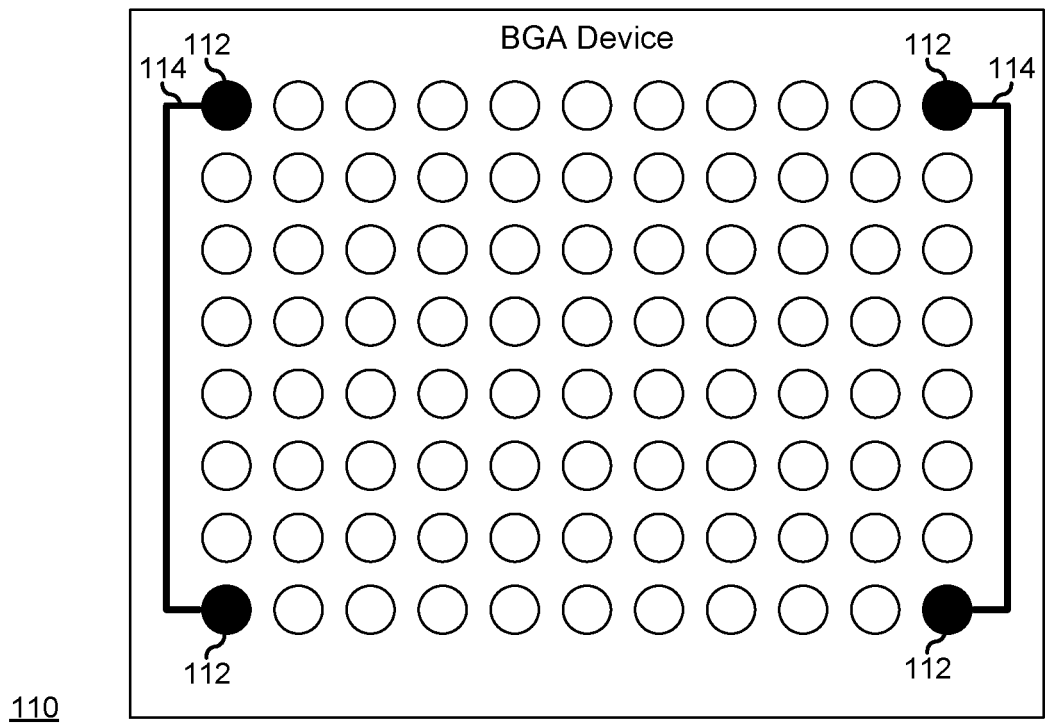

FIG. 1 illustrates a ball grid array (BGA) device 100 as is known in the art, and a BGA device 110 according to an embodiment of the current disclosure. BGA devices 100 and 110 represent surface-mount electronic components that are packaged on BGA substrates, or chip carriers. The particular types of electronic components packaged onto the BGA substrates is not relevant to the understanding of the current disclosure, and will not be further described herein, except as needed to illustrate the current embodiments. Generally, a BGA substrate includes an array of contact pads that form the electrical connections for the packaged electronic component, and that, when soldered to a printed circuit board (PCB) form the mechanical attachment mechanism between the PCB and the BGA substrate. As such, each contact pad is provided with a solder ball that is adhered to the contact pad with a tacky flux material. When the BGA device is to be assembled to the PCB, the BGA is positioned onto the PCB such that the array of contact pads aligns with a complementary array of contact pads on the PCB, and the assembly is heated to reflow the solder balls to permanently affix the BGA device to the PCB.

During the operational life of the BGA device/PCB assembly, mechanical stresses on the assembly can lead to cracking in the solder balls. Such cracking may not significantly reduce the mechanical adhesion of the BGA device to the PCB, but, where cracking is severe, the electrical connections formed by the solder balls may result in open connections, resulting in system errors or failures. Further, where a particular connection is associated with a high-speed data communication interface, even small cracks can lead to reduced signal integrity which again my result in system errors or failures. The mechanical stresses on the assembly may result from bending of the PCB due to warping, thermal stresses, thermal expansion mismatches due to different coefficients of thermal expansion between the BGA device and the PCB, or other mechanical stresses. While the detection of failures and the determination of the root cause of the failures in an information handling system may be somewhat deterministic, it may nevertheless be difficult to ascribe the root cause of the failures to cracked solder balls. It has been understood by the inventors of the current disclosure that, because solder ball cracking begins on a surface of the affected solder ball, and because high frequency signals are transmitted through solder balls via skin effect transmission, that a high frequency signal may be used to advantage for early detection of solder ball cracking on a BGA device.

BGA device manufacturers typically package BGA devices on BGA substrates with an array of connector pads that is larger than the number of electrical connections needed for the packaged electronic device. In this way, BGA substrates with standard numbers of connector pads may be utilized for multiple different types of electronic components and different numbers of needed electrical connections. As such, the typical array of connector pads includes a number of non-critical to function (NCTF) connector pads. Further, BGA device manufacturers typically place a number of these NCTF connector pads at the corners of the array, knowing that the mechanical stresses experienced on the corner solder balls is greater than the mechanical stresses experienced by the inner solder balls.

Here, the corner-placed NCTF solder balls may act as a guard band. That is, because the corner-placed NCTF solder balls may be expected to crack first, the typical BGA device will last longer in an assembled PCB before the stresses would be expected to effect the functional solder balls. As such, BGA device 100 is illustrated with four (4) corner-placed NCTF connector pads 102. Similarly BGA device 110 is illustrated with four (4) corner-placed NCTF connector pads 112. In the embodiment of the current disclosure illustrated by BGA device 110, pairs of NCTF connector pads 112 are electrically connected together by a trace 114 instantiated in the BGA substrate.

Figure 2:
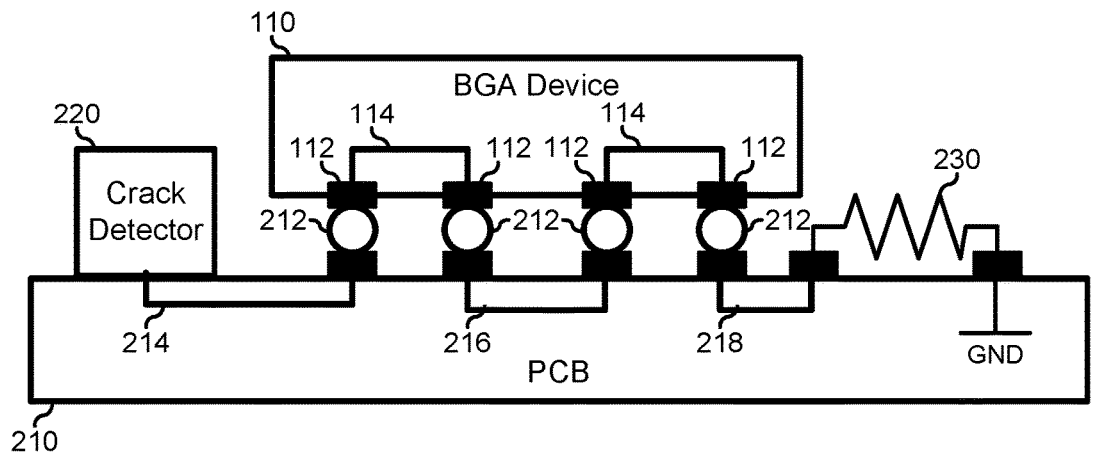
FIG. 2 is a schematic diagram and a block diagram of a solder ball crack detector system according to an embodiment of the current disclosure.
Figure 2:
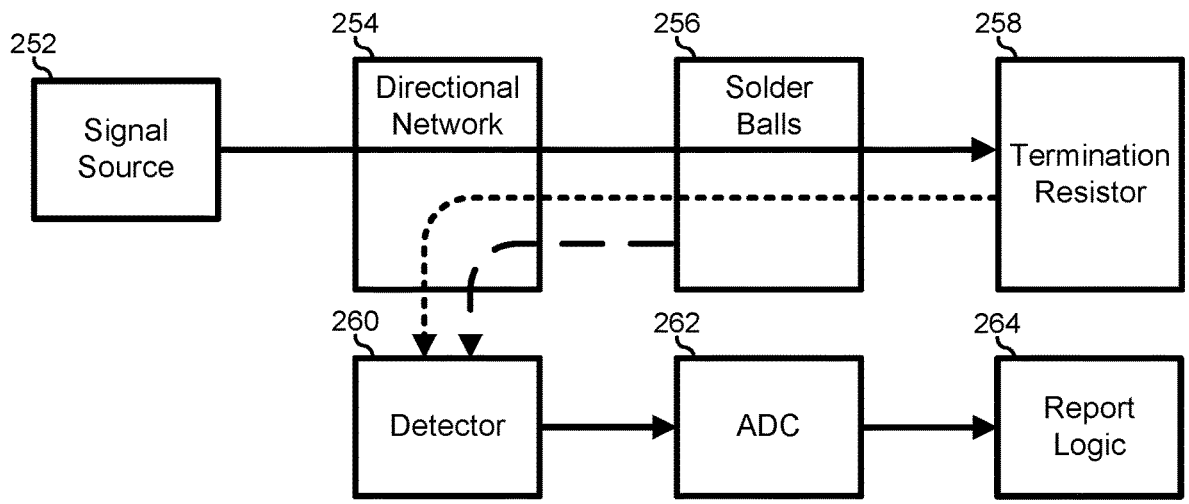
Figure 2:
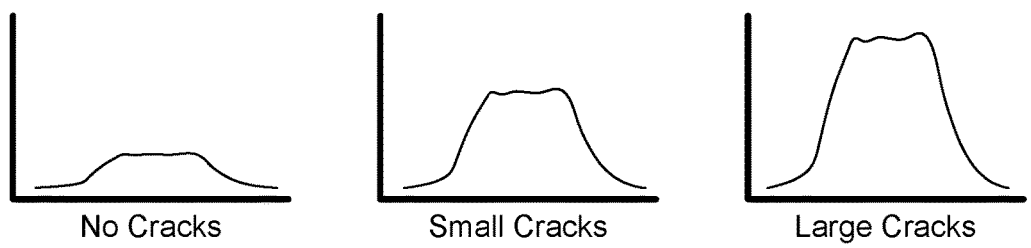

FIG. 2 illustrates a schematic drawing 200 and a block diagram 250 of a crack detection system utilizing BGA device 110. Schematic drawing 200 includes BGA 110, a PCB 210, a crack detector 220, and a termination resistor 230. Crack detector 220 represents a one or more circuit elements that is configured to launch a high frequency signal through solder joint balls 212 associated with NCTF connector pads 212 in a daisy-chain circuit topology to termination resistor 230, and to monitor the reflected signal to detect the cracks in the solder balls. PCB 210 includes signal traces 214, 216, and 218 instantiated in the PCB. Signal trace 214 connects crack detector 220 to a first NCTF connector pad 112 of a first pair of interconnected connector pads, signal trace 216 connects the second NCTF connector pad 112 of the first pair to a first NCTF connector pad of a second pair of interconnected connector pads, and signal trace 218 connects the second NCTF connector pad of the second pair to a first terminal of termination resistor 230. A second terminal of termination resistor 230 is connected to a ground plane of PCB 210.

In operation, a high-speed signal transmitted by crack detector 220 will transit the daisy chain to termination resistor 230. If none of solder balls 212 have cracks, the transmitted high-speed signal will transit the daisy chain and be terminated at termination resistor 230, such that the transmitted high-speed signal will not be reflected back to crack detector 220. On the other hand, if any of solder balls 212 have cracks, the cracks will create an impedance discontinuity in the daisy chain that will result in some of the transmitted high-speed signal being reflected back to crack detector 220.

The operation of the crack detection system can be more easily understood in view of block diagram 250. Block diagram 250 includes a signal source 252, a directional network 254, an array of solder balls 256 to be tested, a termination resistor 258, a detector 260, an analog-to-digital converter (ADC) 262, and report logic 264. Signal source 252 generates the high-frequency signal. Here, it will be understood that skin-effect transmission of high-frequency signals typically reside in a skin depth of ~10 um for a 1 Giga-Hertz (GHz) signal, and that the skin depth decreases as the signal frequency increases. As such, the sized of the detected cracks may depend upon the frequency of the transmitted signal. In a particular embodiment, signal source 252 generates a 3.3 GHz signal. The high-frequency signal is received by directional network 254 and is selectively directed through solder balls 256 termination resistor 258 by directional network 254.

The incident signal received by termination resistor 258 will be substantially terminated by termination resistor 258, and any reflected signal will be small in comparison to the received signal, as indicated by the dotted reflection. On the other hand, where there exist cracks in solder balls 256, the incident high-frequency signal will be reflected by the solder balls, as indicated by the dashed reflection. Directional network 254 receives the reflected signals and selectively directs the reflected signals to detector 260. The reflected signals are provided to ADC 262 which evaluates the magnitude of the reflected signal to determine if cracks are present in solder balls 256. Block diagram 250 illustrates exemplary reflections detected by ADC 262 for solder balls with no cracks, with moderate cracking, and with large cracks. For example, solder balls with no cracks may exhibit a small reflection of −90 to −70 dB, solder balls with moderate cracking may exhibit a medium reflection of −40 to −25 dB, and solder balls with large cracks may exhibit a large reflection of −15 to −5 dB.

ADC 262 provides a digitized representation of the magnitude of the reflected signal to report logic 264. Here, report logic 264 operates to interpret the digitized magnitudes as needed or desired. In a particular embodiment, report logic 264 provides a continuous readout of the digitized magnitudes to a log for further analysis by a management system that includes PCB 210. In another embodiment, report logic 264 performs processing on the digitized magnitudes, such as by defining one or more threshold for the digitized magnitudes. For example, when the digitized magnitudes are below a first threshold, report logic 264 may interpret that no significant cracking is being exhibited. Further, when the digitized magnitudes are above the first threshold but below a second threshold, report logic 264 may interpret that no moderate cracking is being exhibited and may provide a crack warning indication.

Finally, when the digitized magnitudes are above the second threshold, report logic 264 may interpret that significant cracking is being exhibited and may provide a critical crack warning indication. In another embodiment, report logic 264 may provide an adaptive processing on the digitized magnitudes, here reporting a cracking trend based upon previously recorded digitized magnitudes. Here, report logic 264 may ascribe a preset "acceptable" rate of crack formation that would be expected as PCB 210 ages, and may provide a crack formation rate indication when the report logic detects that the rate of crack formation exceeds the preset rate of crack formation.

In a particular embodiment, PCB 210 includes one or more BGA devices similar to BGA device 110 in the daisy chain circuit. In this way, the solder ball cracking on multiple BGA devices may be monitored by crack detector 220. In another embodiment, PCB 210 includes one or more additional crack detectors similar to crack detector 220 and one or more associated termination resistor similar to termination resistor 230. Here, each of one or more additional BGA devices similar to BGA device 110 can be included in their own daisy chain circuits. In this way, each BGA device can individually monitored for solder ball cracks. The above embodiments may be combined, such that some crack detector systems may be configured to monitor individual BGA devices, while other crack detector systems may be configured to monitor multiple BGA devices, as needed or desired.

For example, certain BGA devices may be deemed to be more critical, or may reside in areas of PCB 210 that are known to exhibit higher mechanical stresses on the BGA devices, and may necessitate individual solder ball crack monitoring, while other BGA devices may not need the lame level of solder ball crack monitoring, and so may be grouped together into a common daisy chain network, as needed or desired. In another embodiment, a crack detector system may include other types of solder joints in the daisy chain network to monitor for cracking. For example, PCB 210 may include multiple discrete components, such as resistors and capacitors, or other surface mount devices, such as surface mount ICs, and the like. Here, PCB 210 may include surface mounted zero (0) ohm resistors in the daisy chain in particular areas of interest to monitor for early signs of solder joint cracking, as needed or desired. In another embodiment, in place of ADC 262, a crack detection system may include a more complex signal analyzer, such as a time-domain reflectometer (TDR) or a frequency-domain reflectometer (FDR) that not only detects cracking in the solder balls in the daisy chain network, but also permits the determination of the location along the length of the daisy chain network. In this way, the particular solder balls that are exhibiting cracking may be determined with greater accuracy.

Figure 3:
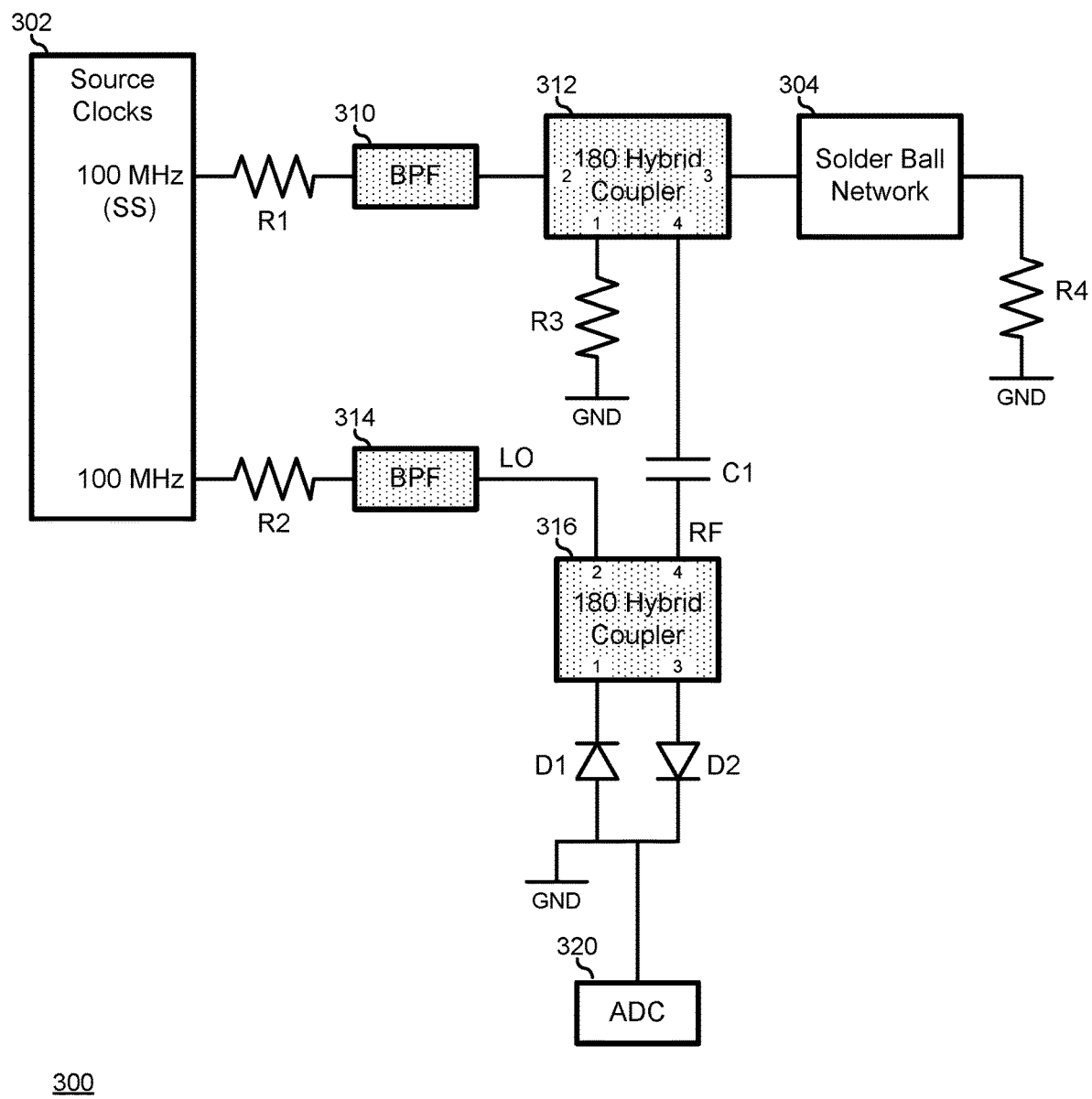
FIG. 3 illustrates an implementation of a solder ball crack detector system according to an embodiment of the current disclosure.

FIG. 3 illustrates an exemplary embodiment of a crack detection system 300 for detecting cracked solder balls in a solder ball network 304. Crack detection system 300 includes source clocks 302, band pass filters (BPFs) 310 and 314, directional couplers 312 and 316, an ADC 320, discrete resistors R1, R2, R3, and R4, a capacitor C1, and diodes D1 and D2. Source clocks 302 include a 100 MHz spread spectrum (SS) clock output, and a modulated 100 MHz clock output. 100 MHz SS clock output is connected to a first terminal of resistor R1, and a second terminal of the resistor is connected to a first terminal of BPF 310. A second terminal of BPF 310 is connected to a second terminal of directional coupler 312. A first terminal of directional coupler 312 is connected to a first terminal of resistor R3 and a second terminal of resistor R3 is connected to a ground plane.

A third terminal of directional coupler 312 is connected to a first terminal of solder ball network 304, a second terminal of the solder ball network is connected to a first terminal of resistor R4, and a second terminal of resistor R4 is connected to the ground plane. A fourth terminal of directional coupler 312 is connected to a first terminal of capacitor C1. 100 MHz modulated clock output is connected to a first terminal of resistor R2, and a second terminal of the resistor is connected to a first terminal of BPF 314. A second terminal of BPF 314 is connected to a second terminal of directional coupler 316. A first terminal of directional coupler 316 is connected to a cathode terminal of diode D1 and an anode terminal of diode D1 is connected to the ground plane. A third terminal of directional coupler 316 is connected to an anode terminal of diode D2 and a cathode terminal of diode D2 is connected to the ground plane. An input of ADC 320 is coupled to the anode of diode D1 and to the cathode of diode D2. A fourth terminal of directional coupler 316 is connected to a second terminal of capacitor C1.

A typical information handling system include one or more clock driver IC, and one or more clock outputs from the clock driver IC may typically be unused. As such, source clocks 302 may be provided by excess clock outputs from the clock driver IC without necessitating the addition of any circuit components in the typical information handling system, and the source clocks therefore are a zero-cost adder to the information handling system. Moreover, BPFs 310 and 314, directional couplers 312 and 316, and capacitor C1 may be instantiated in a PCB of the information handling system as microstrip traces as described below, and are thus designed into the PCB and also represent a zero-cost adder to the information handling system. As such, resistors R1, R2, R3, and R4, diodes D1 and D2, and ADC 320 represent the only cost adders to the information handling system, and represent less than a $0.10 cost adder to the information handling system.

Figure 4:
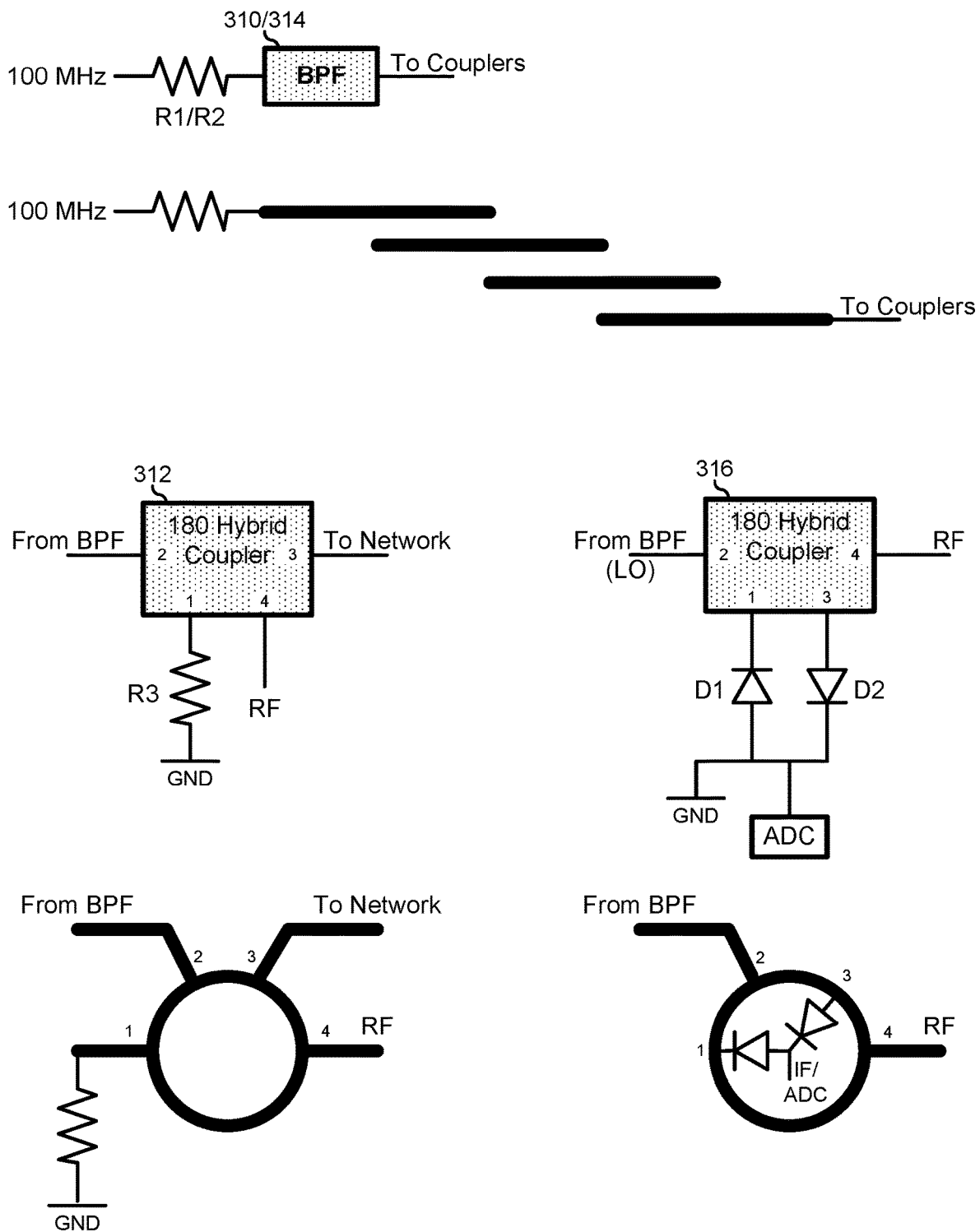
FIG. 4 illustrates microstrip layout implementations of the solder ball crack detector of FIG. 3.

FIG. 4 illustrates BPFs 310 and 314, and directional couplers 312 and 316 as instantiated in microstrip traces on a PCB. BPFs 310 and 314 represent microstrip band pass filters designed to receive the 100 MHz clock signals and to pass through the 3.3 GHz harmonics. The rest of the content of the 100 MHz clock signals is reflected back to the clock outputs and is terminated at the clock drivers. The details of microstrip band pass filters design and manufacturing are known in the art and will not be further described herein, except as needed to illustrate the current embodiments.

Directional coupler 312 represents a microstrip 180-degree hybrid coupler that is sized to provide a 90 degree ($\lambda/4$) phase shift between the terminals 1-2, 2-3, and 3-4, and a 270 degree ($3\lambda/4$) phase shift between terminal 1-4 at the filtered 3.3 GHz input frequency. Here, the filtered 3.3 GHz input test signal is provided on terminal 2, and is evenly split between terminals 1 and 3. The portion of the test signal that exits terminal 1 is terminated in R2 which has a resistance value that matches the microstrip traces (e.g., 50 ohms). Here, terminal 4 is isolated from terminal 2 due to signal cancellation. The portion of the test signal that exits terminal 3 is provided to solder ball network 304 and is reflected back to terminal 3 as described above, such that the reflected signal carries the solder ball crack information. The reflected signal is evenly split between terminals 2 and 4. The portion of the reflected signal that exits terminal 2 is terminated at the clock driver, and the portion of the reflected signal that exits terminal 4 is provided to the mixer stage implemented by directional coupler 316, as described below.

The amplitude of the reflected signal is proportional to the extent of the crack, but it may be difficult to measure the amplitude directly. Here, the reflected signal is down converted to a lower frequency using a mixer implemented by directional coupler 316, similar to directional coupler 312. The inventors of the current disclosure have understood that a low intermediate frequency (IF) signal is desirable over a DC signal. Therefore, the reflected signal is mixed with a frequency signal that is slightly different from the reflected signal. As such, the We want to use a low IF frequency but not DC, so we need a local oscillator (LO) frequency that is slightly different from the reflected signal. As such, the 100 MHz clock output is modulated with a 30 kilo Hertz (kHz) signal and is driven through BPF 314 which is similar to BPF 310 as described above, and that provides the 3.3 GHz harmonics from the 100 MHZ clock output.

The reflected signal is provided on terminal 4 of directional coupler 316, the LO signal from BPF 314 is provided on terminal 2 of the directional coupler, and the RF and LO signals are mixed by the diode pair D1 and D2, to provide the output to ADC 320. The exponential diode current can be approximated with a series that includes squares of the input voltage, resulting in a frequency translation, and that all higher order products will be filtered out. Stated another way, the RF signal (that is, the reflected signal) is the reflected wave, the LO is the incident wave, and the IF is the demodulated spread spectrum signal. The IF signal will contain some DC and higher harmonics that will be filtered away, and a 30 kHz signal is provided to ADC 320 that has its amplitude proportional to the reflected signal. In a particular embodiment, the IF signal is passed through a 30 kHz centered band pass filter and to a peak detector. The output of the peak detector is a DC signal that is proportional to the extent of the cracks, and that can be read by the system through ADC 320. The details of microstrip 108 degree hybrid coupler design and manufacture, signal mixing, and signal extraction using an ADC are known in the art and will not be further described herein, except as needed to illustrate the current embodiments.

Figure 5:
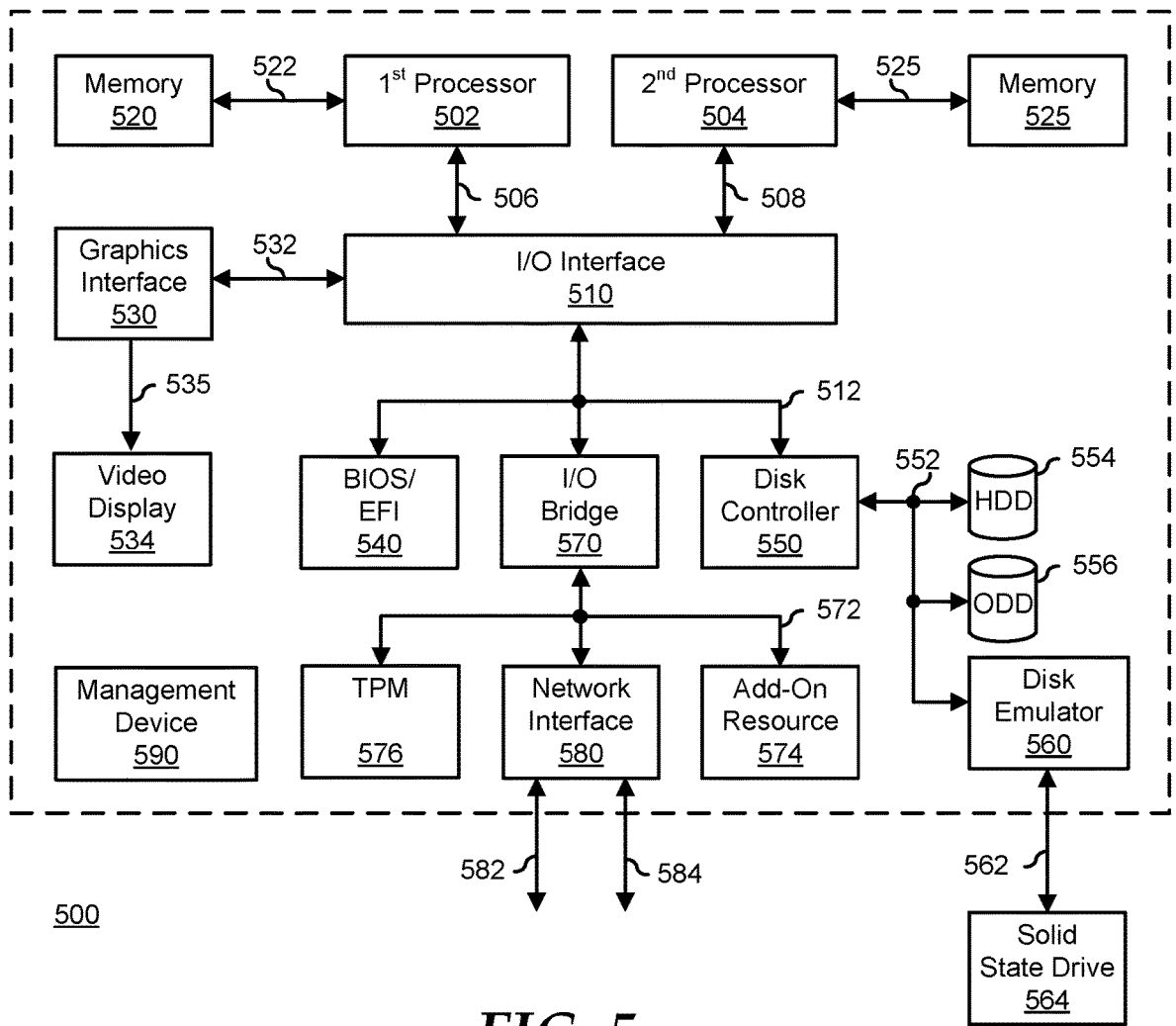
FIG. 5 is a block diagram illustrating a generalized information handling system according to another embodiment of the present disclosure.

FIG. 5 illustrates a generalized embodiment of an information handling system 500. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below, and operates to perform one or more of the methods described below. Information handling system 500 includes a processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, and a management device 590. Processors 502 and 504, I/O interface 510, memory 520, graphics interface 530, BIOS/UEFI module 540, disk controller 550, HDD 554, ODD 556, disk emulator 560, SSD 562, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532, and provides a video display output 535 to a video display 534. In a particular embodiment, information handling system 500 includes separate memories that are dedicated to each of processors 502 and 504 via separate memory interfaces. An example of memories 520 and 525 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 1394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512, or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500. Management device 590 can operate off of a separate power plane from the components of the host environment so that the management device receives power to manage information handling system 500 when the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A system for detecting cracks in solder joints on a printed circuit board (PCB), the system comprising:
a first device including a first contact coupled to a second contact, the first device being soldered to the PCB by a first solder joint at the first contact and by a second solder joint at the second contact;
a signal generator having a test signal output coupled to the first solder joint through the PCB;
a termination resistor having a first terminal coupled through the PCB to the second solder joint, and a second terminal coupled to a ground plane of the PCB; and
a detector coupled to receive a reflected signal, the reflected signal being a reflection of the test signal from at least one of the first solder joint, the second solder joint, and the termination resistor, wherein the detector is configured to provide an indication as to whether at least one of the first solder joint and the second solder joint is cracked based upon a magnitude of the reflected signal.

2. The system of claim 1, wherein;
when there are no cracks in both the first solder joint and the second solder joint, the magnitude of the reflected signal is at a first level;
when there are cracks in at least one of the first solder joint and the second solder joint, the magnitude of the reflected signal is at a second level that is greater than the first level.

3. The system of claim 2, wherein a size of a crack in the at least one of the first solder joint and the second solder joint is proportional to the second magnitude of the reflected signal.

4. The system of claim 1, further comprising a directional coupler that is coupled between the signal generator and the first solder joint, wherein the test signal output is coupled through the PCB to a first terminal of the directional coupler, a second terminal of the directional coupler is coupled through the PCB to the first solder joint, and a third terminal of the directional coupler is coupled through the PCB to the detector, and wherein the directional coupler is configured to pass the test signal to the first solder joint and to pass the reflected signal to the detector.

5. The system of claim 4, wherein the directional coupler includes a 180-degree hybrid coupler.

6. The system of claim 5, wherein the 180-degree hybrid coupler is instantiated on the PCB as a stripline 180-degree hybrid coupler.

7. The system of claim 1, wherein:
the first device further includes a third contact and a fourth contact coupled to the third contact, the first device being further soldered to the PCB by a third solder joint at the third contact and by a fourth solder joint at the fourth contact;
the third contact and the fourth contact are coupled between the second contact and the first terminal of the termination resistor such that second solder joint is coupled through the PCB to the third solder joint, and the fourth solder joint is coupled through the PCB to the first terminal of the termination resistor;
the reflected signal is further a reflection of the test signal from at least one of the third solder joint and the fourth solder joint; and
the magnitude of the reflected signal provides a further indication as to whether or not at least one of the third solder joint and the fourth solder joint is cracked.

8. The system of claim 1, further comprising:
the second device includes a third contact and a fourth contact coupled to the third contact, the second device being soldered to the PCB by a third solder joint at the third contact and by a fourth solder joint at the fourth contact, wherein the third contact and the fourth contact are coupled between the second contact and the first terminal of the termination resistor such that second solder joint is coupled through the PCB to the third solder joint, and the fourth solder joint is coupled through the PCB to the first terminal of the termination resistor;
wherein:
the reflected signal is further a reflection of the test signal from at least one of the third solder joint and the fourth solder joint; and
the magnitude of the reflected signal provides a further indication as to whether or not at least one of the third solder joint and the fourth solder joint is cracked.

9. The system of claim 1, wherein the test signal has a frequency of greater than 1.0 Giga Hertz (GHz).

10. The system of claim 1, wherein the test signal has a frequency of 3.3 Giga Hertz (GHz).

11. A method for detecting cracks in solder joints on a printed circuit board (PCB), the method comprising:
providing, on a first device, a first contact coupled to a second contact;
soldering the first device to the PCB by a first solder joint at the first contact and by a second solder joint at the second contact;
coupling a test signal output of a signal generator to the first solder joint through the PCB;
coupling a first terminal of a termination resistor the PCB to the second solder joint;
coupling a second terminal of the termination resistor a ground plane of the PCB;
coupling a detector to receive a reflected signal that is a reflection of the test signal from at least one of the first solder joint, the second solder joint, and the termination resistor; and
providing, by the detector, indication as to whether at least one of the first solder joint and the second solder joint is cracked based upon a magnitude of the reflected signal.

12. The method of claim 11, wherein;
when there are no cracks in both the first solder joint and the second solder joint, the magnitude of the reflected signal is at a first level;
when there are cracks in at least one of the first solder joint and the second solder joint, the magnitude of the reflected signal is at a second level that is greater than the first level.

13. The method of claim 12, wherein a size of a crack in the at least one of the first solder joint and the second solder joint is proportional to the second magnitude of the reflected signal.

14. The method of claim 11, further comprising:
coupling a directional coupler between the signal generator and the first solder joint, wherein the test signal output is coupled through the PCB to a first terminal of the directional coupler, a second terminal of the directional coupler is coupled through the PCB to the first solder joint, and a third terminal of the directional coupler is coupled through the PCB to the detector;
passing, by the directional coupler, the test signal to the first solder joint; and
passing, by the directional coupler, the reflected signal to the detector.

15. The method of claim 14, wherein the directional coupler includes a 180-degree hybrid coupler.

16. The method of claim 15, wherein the 180-degree hybrid coupler is instantiated on the PCB as a stripline 180-degree hybrid coupler.

17. The method of claim 11, wherein:
providing, on the first device, a third contact and a fourth contact coupled to the third contact;
soldering the first device to the PCB by a third solder joint at the third contact and by a fourth solder joint at the fourth contact, wherein the third contact and the fourth contact are coupled between the second contact and the first terminal of the termination resistor such that second solder joint is coupled through the PCB to the third solder joint, and the fourth solder joint is coupled through the PCB to the first terminal of the termination resistor;
wherein the reflected signal is further a reflection of the test signal from at least one of the third solder joint and the fourth solder joint; and
wherein the magnitude of the reflected signal provides a further indication as to whether or not at least one of the third solder joint and the fourth solder joint is cracked.

18. The method of claim 11, further comprising:
providing, on a second device, a third contact and a fourth contact coupled to the third contact'
soldering the second device to the PCB by a third solder joint at the third contact and by a fourth solder joint at the fourth contact, wherein the third contact and the fourth contact are coupled between the second contact and the first terminal of the termination resistor such that second solder joint is coupled through the PCB to the third solder joint, and the fourth solder joint is coupled through the PCB to the first terminal of the termination resistor;
wherein the reflected signal is further a reflection of the test signal from at least one of the third solder joint and the fourth solder joint; and wherein the magnitude of the reflected signal provides a further indication as to whether or not at least one of the third solder joint and the fourth solder joint is cracked.

19. The system of claim 1, wherein the test signal has a frequency of greater than 1.0 Giga Hertz (GHz).

20. A system for detecting cracks in solder joints on a printed circuit board (PCB), the system comprising:
- a clock source having a first clock output and a second clock output;
- a first band pass filter (BPF) having a first terminal coupled to the first clock output and a second terminal;
- a first directional coupler having a first terminal coupled to the second terminal of the first BPF, a second terminal, and a third terminal;
- a solder ball network having a first terminal coupled to the second terminal of the first directional coupler and a second terminal;
- a termination resistor having a first terminal coupled to the second terminal of the solder ball network and a second terminal coupled to a ground plane of the PCB;
- a second BPF having a first terminal coupled to the second clock output and a second terminal;
- a second directional coupler having a first terminal coupled to the second terminal of the second BPF, a second terminal coupled to the third terminal of the first directional coupler, a third terminal, and a fourth terminal;
- a first diode having a cathode terminal coupled to the third terminal of the second directional coupler and an anode terminal;
- a second diode having an anode terminal coupled to the fourth terminal of the second directional coupler and a cathode terminal coupled to the anode terminal of the first diode and to the ground plane; and
- an analog-to-digital converter having an input coupled to the anode terminal of the first diode and to the cathode terminal of the second diode.

* * * * *